United States Patent [19]
Cho

[11] Patent Number: 5,753,040
[45] Date of Patent: May 19, 1998

[54] METHOD FOR THE GROWTH OF EPITAXIAL METAL-INSULATOR-METAL-SEMICONDUCTOR STRUCTURES

[75] Inventor: Chih-Chen Cho, Richardson, Tex.

[73] Assignee: Texas Instruments Incorporated, Dallas, Tex.

[21] Appl. No.: 474,618

[22] Filed: Jun. 7, 1995

Related U.S. Application Data

[62] Division of Ser. No. 302,302, Sep. 8, 1994, Pat. No. 5,529,640, which is a continuation of Ser. No. 48,406, Jun. 21, 1993, Pat. No. 5,364,468, which is a division of Ser. No. 841,172, Feb. 25, 1992, Pat. No. 5,229,332.

[51] Int. Cl.$^6$ ............................................ C30B 23/08
[52] U.S. Cl. .................... 117/106; 117/108; 117/109; 117/990
[58] Field of Search .................... 117/106, 940, 117/108, 109

[56] References Cited

U.S. PATENT DOCUMENTS

| | | | |
|---|---|---|---|
| 4,665,412 | 5/1987 | Ohkawa et al. | 357/6 |
| 4,870,032 | 9/1989 | Johnston, Jr. et al. | 437/84 |
| 4,935,382 | 6/1990 | Johnston, Jr. et al. | 437/81 |
| 5,229,332 | 7/1993 | Cho | 117/940 |
| 5,229,333 | 7/1993 | Cho et al. | 117/940 |

OTHER PUBLICATIONS

Cho, et al., "Low Temperature Epitaxial Growth of Al On Si(III) and CaF2(III) Using Molecular Beam Epitaxy," *Materials Research Society Symposium Proceedings*, vol. 221, 1991, pp. 87-92.

Cho, et al., "Epitaxial Growth of an Al/CaF$_2$/Al/Si(111) Structure," *Applied Physics Letters*, vol. 61, No. 3, Jul. 20, 1992, pp. 270-272.

Fathauer, et al., "Heteroepitaxy of Insulator/Metal/Silicon Structures: CaF$_2$/NiSi$_2$/Si(111) and CaF$_2$/CoSi$_2$/Si(111)," *Appl. Phys. Lett.*, vol. 49, No. 2, Jul. 14, 1986, pp. 64-66.

Ishiwara, et al., "Heteroepitaxy of Si,Ge, and GaAs Films on CaF$_2$/Si Structures," *Materials Research Society Symposium Proceedings*, vol. 67, Apr. 16-18, 1986, pp. 105-114.

Petroff, et al., "Properties of Aluminum Epitaxial Growth on GaAs," *J. Appl. Phys.*, vol. 52, No. 12, Dec. 1981, pp. 7317-7320.

Phillips, et al., "Growth of an Expitaxial Insulator-Metal-Semiconductor Structure on Si by Molecular Beam Epitaxy," *Appl. Phys. Lett.*, vol. 48, No. 7, Feb. 17, 1986, pp. 463-465.

Phillips, et al., "Using Rapid Thermal Annealing to Improve Epitaxial CaF$_2$/CoSi$_2$/Si(111) Structures," *Mat. Res. Soc. Symp. Proc.*, vol. 67, 1986, pp. 115-118.

Schowalter, et al., "Growth and Characterization of Single Crystal Insulators on Silicon," *Critical Reviews™ in Solid State and Materials Sciences*, vol. 15, Issue 4 (1989), pp. 367-421.

Yamada, et al., "Metallization by Ionized Cluster Beam Deposition," *IEEE Transactions on Electron Devices*, vol. Ed-34, No. 5, May 1987, pp. 1018-1025.

*Primary Examiner*—Robert Kunemund
*Attorney, Agent, or Firm*—Michael K. Skrehot; James C. Kesterson; Richard L. Donaldson

[57] ABSTRACT

In one form of the invention, a method for the growth of an epitaxial insulator-metal structure on a semiconductor surface comprising the steps of maintaining the semiconductor surface at a pressure below approximately $1 \times 10^{-7}$ mbar, maintaining the semiconductor surface at a substantially fixed first temperature between approximately 25° C. and 400° C., depositing an epitaxial metal layer on the semiconductor surface, adjusting the semiconductor surface to a substantially fixed second temperature between approximately 25° C. and 200° C., starting a deposition of epitaxial CaF$_2$ on the first metal layer, ramping the second temperature to a third substantially fixed temperature between 200° C. and 500° C. over a time period, maintaining the third temperature until the epitaxial CaF$_2$ has deposited to a desired thickness, and stopping the deposition of epitaxial CaF$_2$ on the first metal layer.

Other devices, systems and methods are also disclosed.

6 Claims, 7 Drawing Sheets

5,753,040

1

METHOD FOR THE GROWTH OF EPITAXIAL METAL-INSULATOR-METAL-SEMICONDUCTOR STRUCTURES

This is a divisional of application Ser. No. 08/302,302, filed Sep. 8, 1994; now U.S. Pat. No. 5,329,680, which is a continuation of application Ser. No. 08/048,406, filed Jun. 21, 1993 (U.S. Pat. No. 5,364,468); which is a divisional of parent application Ser. No. 07/841,172, filed Feb. 25, 1992 (U.S. Pat. 5,229,332).

FIELD OF THE INVENTION

This invention generally relates to growth of epitaxial $CaF_2$/metal/Si, metal/$CaF_2$/Si, and metal/$CaF_2$/metal/Si structures.

BACKGROUND OF THE INVENTION

Without limiting the scope of the invention, its background is described in connection with semiconductor devices, as an example.

Heretofore, in this field, the epitaxial growth of insulators on semiconductors has been an important step in the fabrication of various electronic devices, such as metal-insulator-semiconductor field effect transistors (MISFETs), silicon on insulator (SOI) technology, three dimensional integrated circuits, etc., as well as novel devices that cannot be achieved with amorphous insulators. Epitaxial growth of Group II fluoride on silicon has been studied extensively because of its technological and scientific interest. As one of the most promising candidates in this area, the $CaF_2$/Si couple has attracted considerable attention. From a materials preparation point of view, $CaF_2$ is a relevant choice among the fluorides for deposition on silicon because it fits several important criteria for a good epitaxial system, i.e. small lattice mismatch and similar cubic structure. Previous studies have shown that the chemical and structural properties of the $CaF_2$/Si interface vary under different deposition conditions and that these variations can significantly change the electrical characteristics of a system incorporating this interface. Co-assigned patent application 07/704,535 describes a method that allows the growth of films in which the orientation of the $CaF_2$ film is essentially identical to that of the silicon substrate, a characteristic which is important for good interface properties.

Additionally, the epitaxial growth of Al on Si has attracted increasing interest because it might offer a solution to the reliability problems caused by polycrystalline Al, which is widely used in the metallization of integrated circuits. Recent studies have shown that the electromigration resistance of single crystal Al is significantly better than that of polycrystalline Al. Improvement in thermal stability has also been reported when single crystal Al is used. Similar advantages exist for epitaxial conductors on insulators. Yamada and Takagi, IEEE Transactions on Electron Devices, vol. 34, 5, May 1987, report the growth of single crystal Al on epitaxial $CaF_2$ using ion cluster beam (ICB) epitaxy. ICB relies on high electric fields to provide ions with kinetic energy, and by so doing allows the growth of epitaxial films using low substrate temperatures.

SUMMARY OF THE INVENTION

It is herein recognized that a method using production-capable techniques, such as molecular beam epitaxy (MBE) or chemical vapor deposition (CVD), for the deposition of Al on $CaF_2$ would be desirable, since ion cluster beam

2 epitaxy is not presently widely used in industry, and requires a relatively complex apparatus. Furthermore, not only is the ability to grow single crystal metal on insulator and on semiconductor desirable, but so also is the epitaxial growth of insulator on a conductive layer. The growth of $CaF_2$ on metal silicides has been reported, but the growth of this insulator on a single element metal, such as Al, has not. Although measurement is difficult, the interface of $CaF_2$ with a single element metal is felt to be superior in terms of abruptness when compared to a $CaF_2$ interface with metal silicide. The ability to grow insulators, such as $CaF_2$, on epitaxial single element metals allows the formation of epitaxial metal-insulator-metal structures that can be used to create metal-insulator superlattices and common-gate transistors, among others. Although ion cluster beam epitaxy has been used to grow epitaxial Al on $CaF_2$, it is felt that the kinetic ions inherent to the technique may hinder the epitaxial growth of $CaF_2$ on single crystal Al. This is because of the damaging effects of ion bombardment during $CaF_2$ growth on the relatively soft Al surface.

Thus, a need exists for a method for the epitaxial growth of metal-$CaF_2$-metal structures on semiconductor substrates. Furthermore, it is recognized herein that a need exists for a production-capable method of growing epitaxial $CaF_2$ on single crystal metal, and also of depositing single crystal metal on epitaxial $CaF_2$. The present invention is directed toward meeting those needs.

Generally, and in one form of the invention, a method for the growth of an epitaxial insulator-metal structure on a semiconductor surface comprising the steps of maintaining the semiconductor surface at a pressure below approximately $1 \times 10^{-7}$ mbar, maintaining the semiconductor surface at a substantially fixed first temperature between approximately 25° C. and 400° C., depositing an epitaxial first metal layer on the semiconductor surface, adjusting the semiconductor surface to a substantially fixed second temperature between approximately 25° C. and 200° C., starting a deposition of epitaxial $CaF_2$ on the metal layer, ramping the second temperature to a third substantially fixed temperature between 200° C. and 500° C. over a time period, maintaining the third temperature until the epitaxial $CaF_2$ has deposited to a desired thickness, and stopping the deposition of epitaxial $CaF_2$ on the first metal layer.

An advantage of the invention is that it, apparently for the first time, allows the formation of an epitaxial insulator-metal-semiconductor structure. Similarly, it allows the formation of an epitaxial metal-insulator-semiconductor structure and, again apparently for the first time, a metal-insulator-metal-semiconductor structure.

BRIEF DESCRIPTION OF THE DRAWINGS

In the drawings.

Corresponding numerals and symbols in the different figures refer to corresponding parts unless otherwise indicated.

DETAILED DESCRIPTION OF PREFERRED EMBODIMENTS

Figure 1:
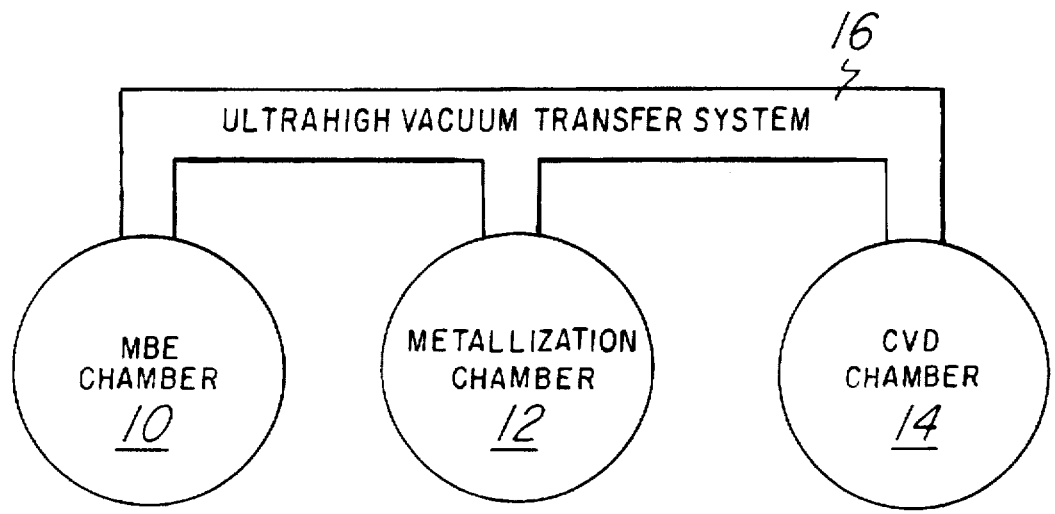
FIG. 1 is a schematic diagram of the ultrahigh vacuum system.

The preferred embodiment processes were all carried out in an ultrahigh vacuum system (e.g. a VG Semicon V80), a schematic of which is shown in FIG. 1. The vacuum system is composed of a molecular beam epitaxy (MBE) chamber 10, a metallization chamber 12, and a chemical vapor deposition chamber 14. Wafers can be transferred between these three chambers through an ultrahigh vacuum transfer system 16, which is annexed with two loading locks. In the preferred embodiment processes described herein and diagrammatically shown in FIGS. 2, 3, and 4, the base pressure of the MBE chamber and the metallization chamber were below $1 \times 10^{-10}$ mbar and $1 \times 10^{-10}$ mbar, respectively. The chamber pressure during CaF$_2$ growth was $5 \times 10^{-10}$ mbar, and the process pressure during Al growth was $2 \times 10^{-9}$ mbar. Before Al or CaF$_2$ deposition, clean Si(111) surfaces were obtained by annealing Si(111) wafers in the MBE chamber at 950° C. for 10 min, plus another 10 min with Si fluxing at a rate of 0.01 monolayer/sec. Reflection high-energy electron diffraction (RHEED) and Auger spectroscopy were used to characterize the cleaning process. The cleaning and characterization processes are shown in steps 18 and 20 of FIGS. 2, 3, and 4.

Figure 2:
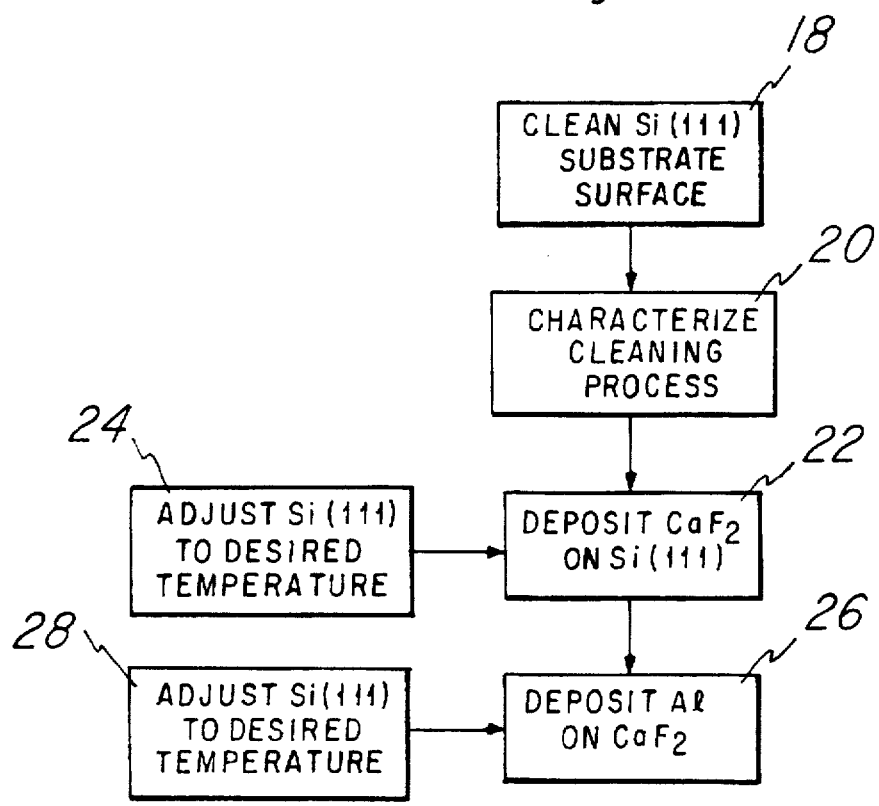
FIG. 2 is a process flow diagram of the first preferred embodiment method of the invention.
Figure 5:
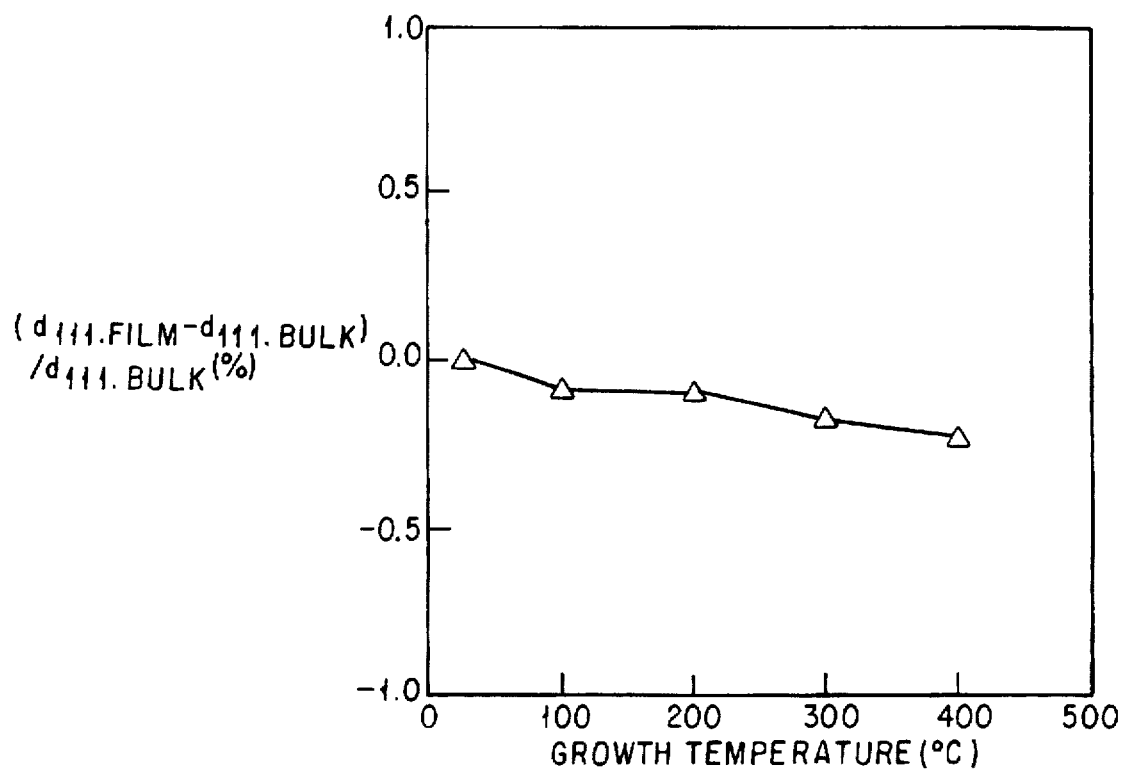
FIG. 5 is a chart showing the lattice distortion of Al films relative to bulk Al.
Figure 6:
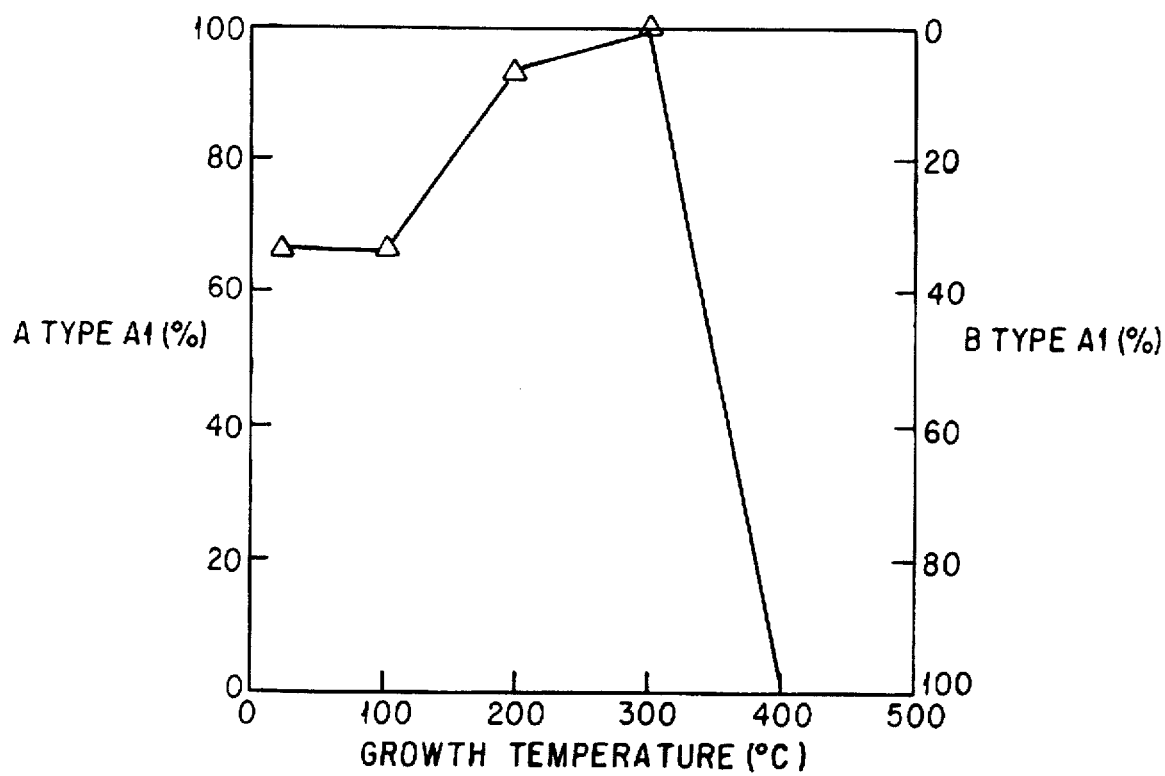
FIG. 6 is a graph showing Al film type with respect to temperature.

In the first preferred embodiment process, a flow diagram of which is shown in FIG. 2, CaF$_2$ films were deposited 22 on Si(111) using MBE after the Si(111) substrate temperature had been adjusted 24 to 700° C. For better CaF$_2$ crystalline quality, the substrate temperature can be ramped between 100° C. and 600° C. over five minutes and then held at 600° C. for the duration of the CaF2$_A$ deposition. After transferring the wafer to the metallization chamber, Al films were deposited 26 on the CaF$_2$ films at various temperatures from 25° C. to 400° C. 28. X-ray rocking curve measurements taken from the Al/CaF$_2$/Si(111) samples show that single crystal Al(111) was grown epitaxially on CaF$_2$(111) /Si(111). FIG. 5 shows the lattice distortion of the Al films, compared to bulk Al, and FIG. 6 shows the percentage of A-type and B-type domains in the Al films grown at different temperatures. It is evident from FIG. 6 that 300° C. is the temperature where the Al films were A-type with respect to the CaF$_2$ film. "A-type" epitaxy denotes the growth of a film with crystalline orientations identical to the substrate. "B-type" epitaxy refers to film with crystalline orientations identical to the orientations of an azimuthally rotated substrate. For a surface of n-fold symmetry, the azimuthal rotation angle is 360°/2n or 360°/2n plus a multiple of 360°/n. For surfaces with threefold symmetry such as Si(111) and CaF$_2$(111), the azimuthal rotation angle is 60° (or 180° and 300°). An advantage of A-type films is that when they are grown over small steps in the underlying layer, generally, smaller dislocation densities and improved crystal quality result when compared to B-type films.

Figure 3:
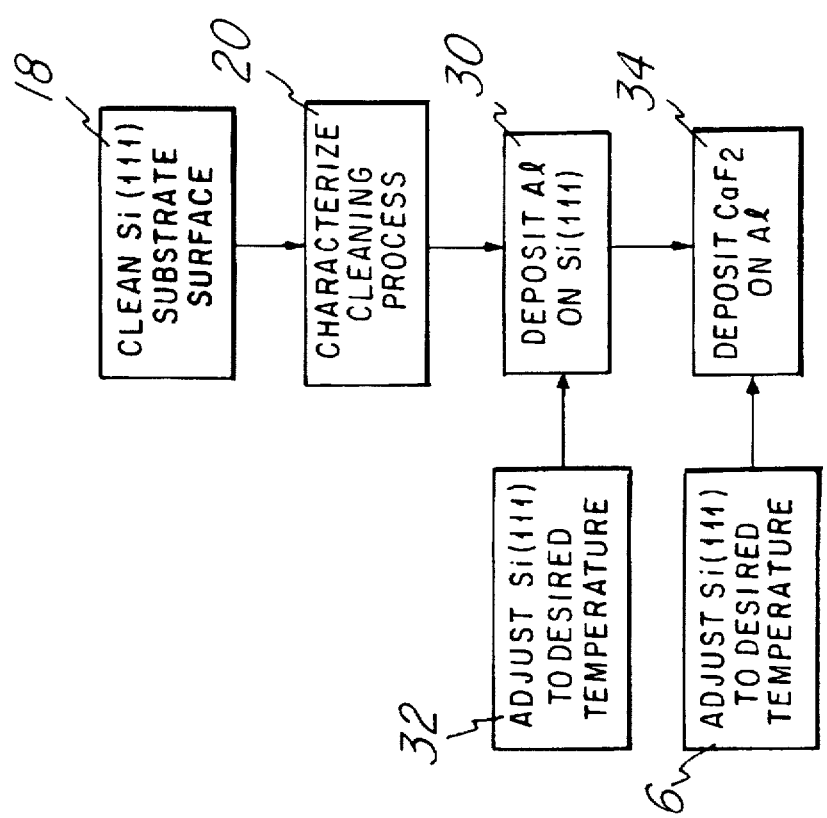
FIG. 3 is a process flow diagram of the second preferred embodiment method of the invention.

In a second preferred embodiment process, shown in FIG. 3, Al films were deposited 30 in the metallization chamber at 300° C. and 400° C. 32 to obtain films of different epitaxial relations with respect to the Si substrates. The 300° C. substrate temperature produced A-type film, whereas 400° produced B-type film. After the Al growth, the wafers were transferred back to the MBE chamber and CaF$_2$ was deposited 34 on the top of the Al films by ramping the growth temperature from 100° C. to 300° C. in five minutes and then maintaining at 300° C. 36 until the end of the CaF$_2$ growth. The ramping step is used to reduce the substrate temperature during the early stage of the CaF$_2$ growth so that intermixing between Al and CaF$_2$ can be suppressed.

Figure 7A:
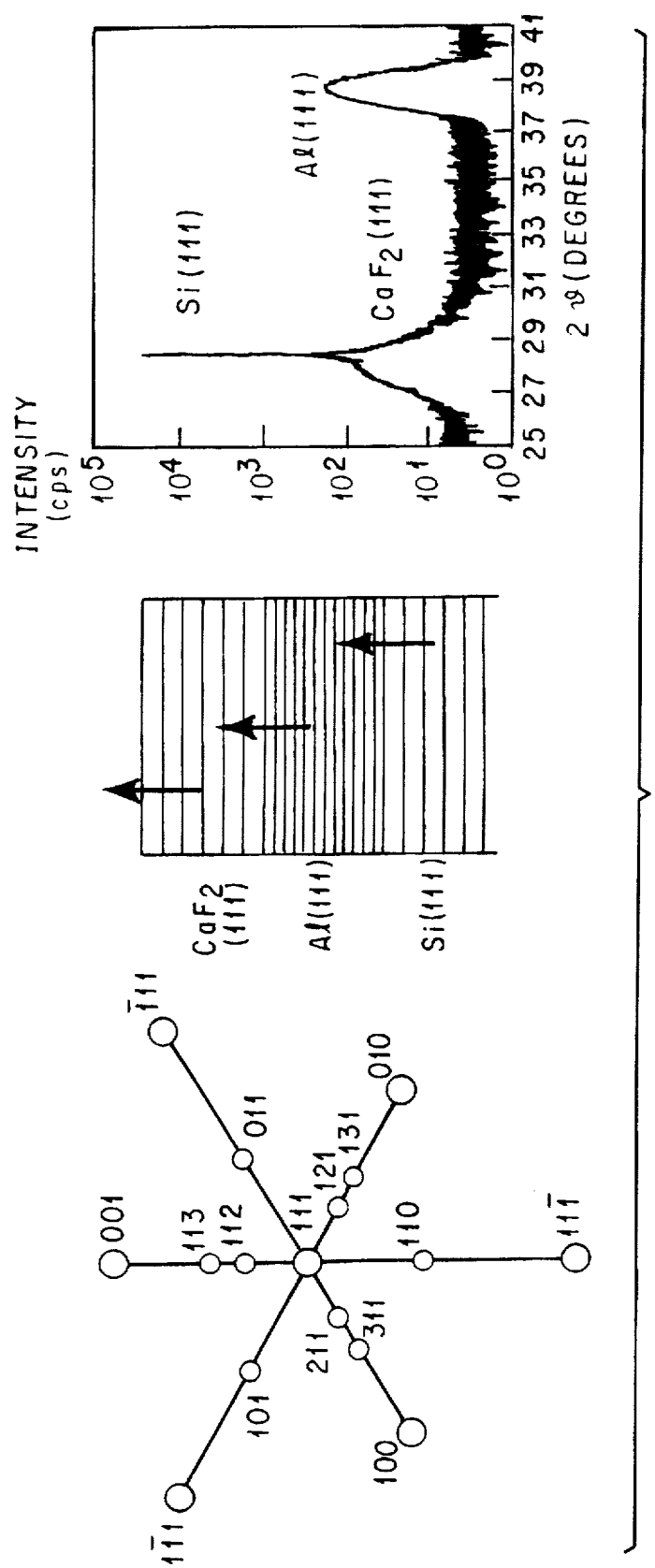
FIG. 7a shows a standard (111) projection of a cubic crystal and the x-ray rocking curve of Si(111), $CaF_2$(111), and Al(111) detected from a $CaF_2$/Al/Si(111) sample.
Figure 7B:
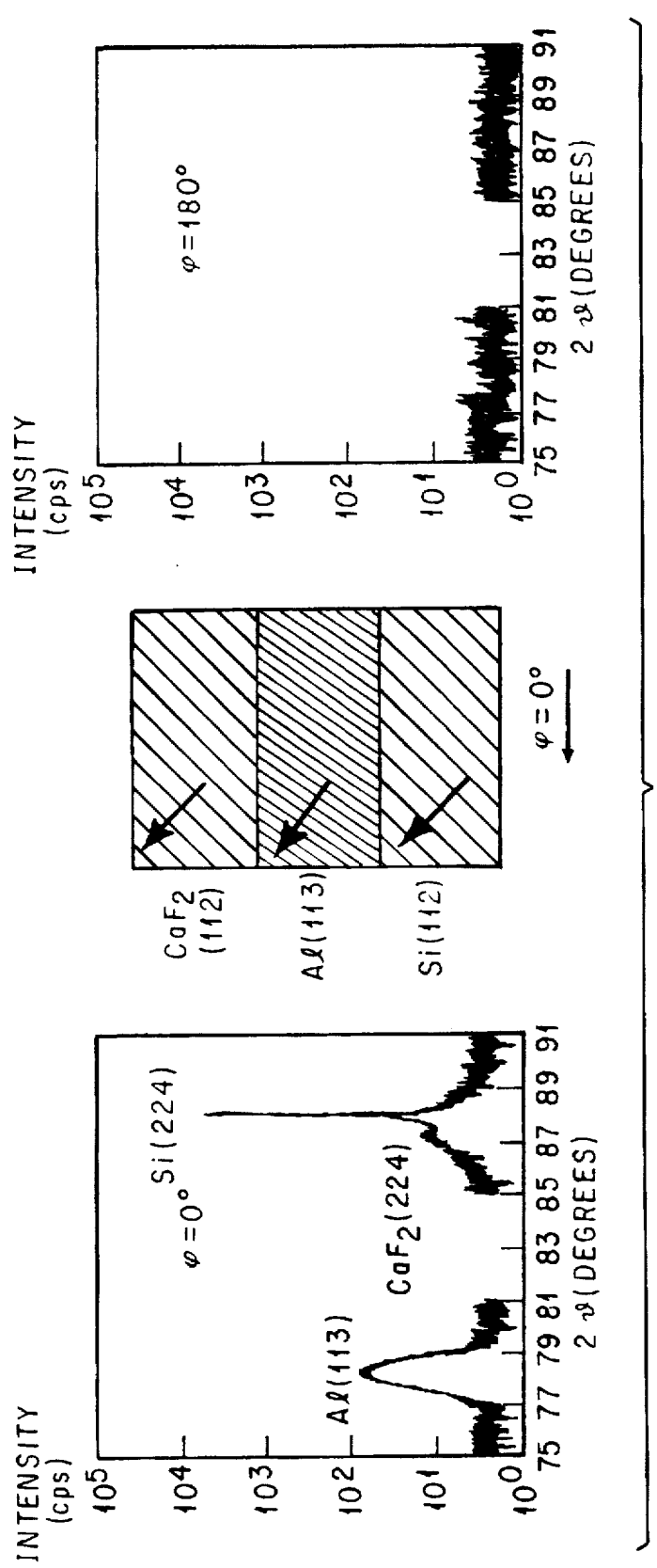
FIG. 7b shows the rocking curves of Al(113), CaF$_2$(224), and Si(224) detected from a CaF$_2$/Al/Si(111) sample with Al grown at 300° C.
Figure 7C:
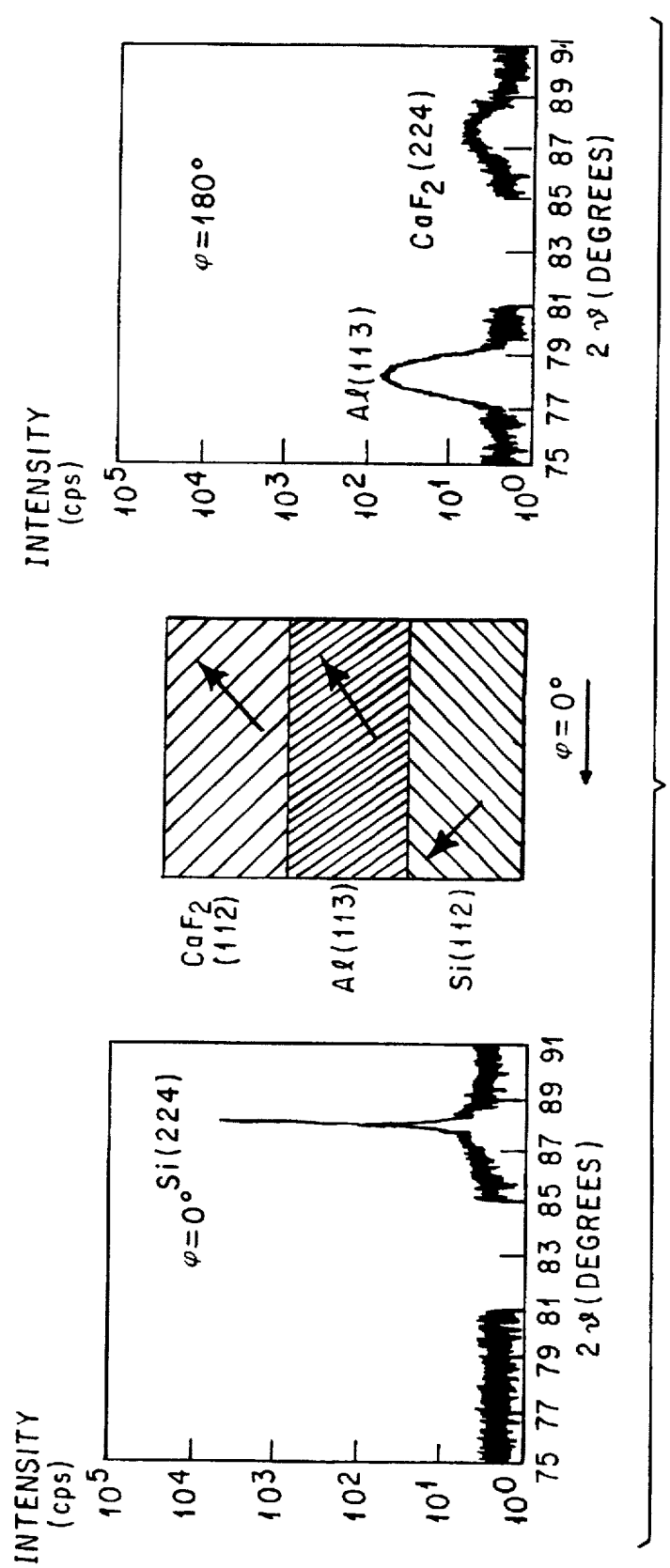
FIG. 7c shows rocking curves taken from a CaF$_2$/Al/Si (111) sample with Al grown at 400° C.

As in the first preferred embodiment process, x-ray diffraction measurements were carried out at room temperature on the samples. FIG. 7(a) shows a standard (111) projection of a cubic crystal and the x-ray rocking curve of Si(111), CaF$_2$(111), and Al(111) peaks detected from a CaF/Al/Si (111) sample. FIG. 7(b) shows the rocking curves of Al(113), CaF$_2$(224) and Si(224) detected from a CaF$_2$/Al/ Si(111) sample with Al grown at 300° C. When the x-ray diffraction is taken along the <001> direction of the Si substrate (azimuthal angle $\phi=0°$), Al(113), CaF$_2$(224), and Si(224) peaks are observed. In contrast, no peak is observed at the same Bragg angles when the sample is rotated 180° about the surface normal ($\phi=180°$). These rocking curves demonstrate that both the Al and the CaF$_2$ films grow with "A-type" epitaxial relations. FIG. 7(c) shows rocking curves taken from a CaF$_2$/Al/Si(111) sample with Al grown at 400° C. While no Al(113) and CaF$_2$(224) peaks are observed along the Si<001> azimuthal direction ($\phi=0°$), both peaks are observed after the sample is rotated 180° about the surface normal. These results show that while the epitaxial relation between Al and Si is "B-type" the crystalline orientations of CaF$_2$ are still identical to the Al film (A-type). Using the Si(111) peak from the substrate as a reference, we can obtain the precise Bragg angle of Al(111) to derive the plane distance along the [111] direction. The lattice distortions of Al(111) grown on Si(111) at 300° C. and 400° C. are 0.08% and 0.29% (tensile stress), respectively. After CaF$_2$ growth, the lattice distortions of the Al films are 0.02% and 0.17% (tensile).

The full-width-half-maximum (FWHM) of the symmetric (111) reflection curve was used to estimate the crystal quality of these films. For films of the same thickness, a smaller FWHM indicates better crystalline quality. The FWHMs of the Al(111) rocking curves are around 400–600 arcsec, the FWHMs of the Al(111) peaks obtained from the CaF$_2$/Al/Si(111) structures are between 1000–1800 arcsec. This indicates that the crystalline quality of Al deteriorates after the growth of CaF$_2$. In contrast, the FWHMs of the CaF$_2$(111) peaks obtained from the CaF$_2$/Al/Si(111) structures are around 2400 arcsec. This is close to the typical FWHM (2250 arcsec) of a CaF$_2$ film of the same thickness grown on Si(111) at 300° C.

Figure 4:
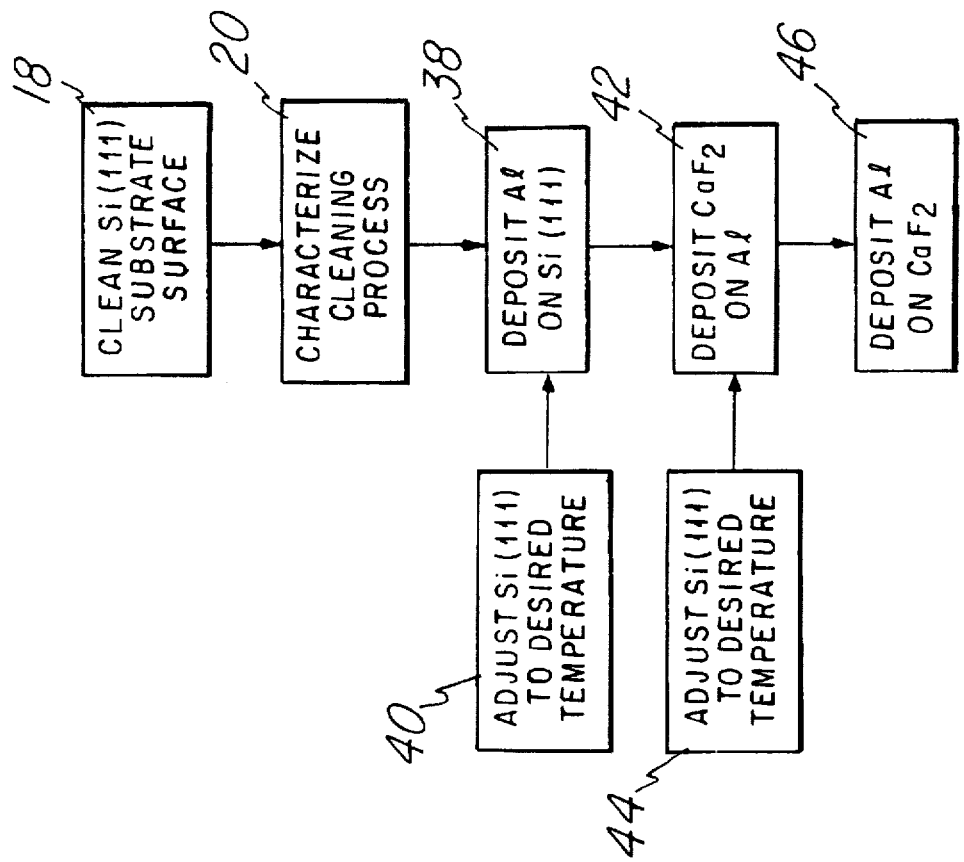
FIG. 4 is a process flow diagram of the third preferred embodiment method of the invention.

In a third preferred embodiment process, shown in FIG. 4, Al films were deposited 38 in the metallization chamber at 300° C. and 400° C. 40 to obtain films of different epitaxial relations with respect to the Si substrates. After the Al growth, the wafers were transferred back to the MBE chamber and CaF$_2$ was deposited 42 on the top of the Al films by ramping the growth temperature from 100° C. to 300° C. in five minutes and then maintaining at 300° C. 44 until the end of the CaF$_2$ growth. The wafers were then transferred back to the metallization chamber to deposit 46 epitaxial Al on top of the CaF$_2$ layer. The deposition rate of CaF$_2$ was 4 nm/min and the effusion cell temperature was 1150° C. The thicknesses of the Al and CaF$_2$ films used in this study were 300–500 nm and 100–200 nm, respectively.

Figure 8:
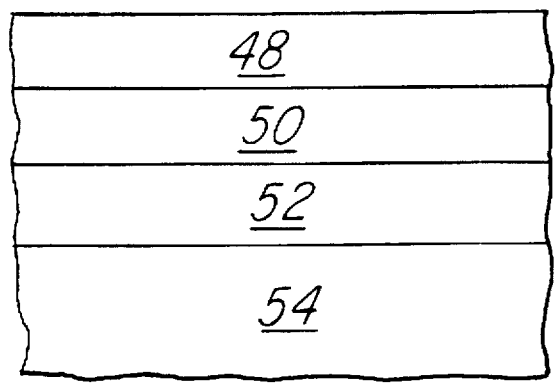
FIG. 8 is a cross-section of an epitaxial metal-CaF$_2$-metal-semiconductor structure.

FIG. 8 is a cross-sectional view of the epitaxial metal 48, CaF$_2$ 50, metal 52, semiconductor 54 structure formed by the third preferred embodiment process.

A few preferred embodiments have been described in detail hereinabove. It is to be understood that the scope of the invention also comprehends embodiments different from those described, yet within the scope of the claims. Words of inclusion are to be interpreted as nonexhaustive in considering the scope of the invention.

While this invention has been described with reference to illustrative embodiments, this description is not intended to be construed in a limiting sense. In particular, the use of silicon in the (111) orientation in the description of the preferred embodiments is not intended to suggest that other orientations are excluded from the benefits of the invention. Also, the use of molecular beam epitaxy (MBE) in the description of the preferred embodiments is not intended to suggest that the inventive method cannot be performed with other forms of neutral beam epitaxy (i.e. epitaxy that does not rely on kinetic ions), such as chemical vapor deposition (CVD). Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for the growth of epitaxial CaF$_2$ and metal on a semiconductor surface, comprising the steps of:

forming epitaxial CaF$_2$ on said semiconductor surface using neutral beam epitaxy while ramping the temperature of said semiconductor surface from approximately 100° C. to approximately 600° C. over a period of approximately five minutes and then holding the temperature of said semiconductor surface at approximately 600° C.;

adjusting said semiconductor surface to a second temperature between approximately 25° C. and 400° C.; and forming epitaxial metal on said CaF$_2$.

2. The method of claim 1 wherein said epitaxial metal is an elemental metal.

3. The method of claim 2 wherein said elemental metal is aluminum.

4. The method of claim 1 wherein said neutral beam epitaxy is molecular beam epitaxy.

5. The method of claim 1 wherein said second temperature is approximately 300° C.

6. The method of claim 1 wherein said substrate is silicon(111).

* * * * *